(12) United States Patent
Rakhovsky

(10) Patent No.: US 9,323,219 B2
(45) Date of Patent: *Apr. 26, 2016

(54) METHOD OF MICROLITHOGRAPHY WITH THE USE OF DIVERGENT/CONVERGENT BEAMS FOR HOLOGRAPHIC RESTORATION OF AN IMAGE

(71) Applicant: Vadim Rakhovsky, Moscow (RU)

(72) Inventor: Vadim Rakhovsky, Moscow (RU)

( * ) Notice: Subject to any disclaimer, the term of this patent is extended or adjusted under 35 U.S.C. 154(b) by 0 days.

This patent is subject to a terminal disclaimer.

(21) Appl. No.: 14/520,376

(22) Filed: Oct. 22, 2014

(65) Prior Publication Data

US 2015/0185696 A1 Jul. 2, 2015

Related U.S. Application Data

(63) Continuation-in-part of application No. 14/142,776, filed on Dec. 28, 2013.

(51) Int. Cl.
*G03H 1/22* (2006.01)
*G03F 7/20* (2006.01)
*G03H 1/00* (2006.01)
*G03H 1/08* (2006.01)

(52) U.S. Cl.
CPC .......... *G03H 1/2286* (2013.01); *G03F 7/70408* (2013.01); *G03H 2001/0094* (2013.01); *G03H 2001/0816* (2013.01); *G03H 2222/52* (2013.01); *G03H 2222/53* (2013.01); *G03H 2240/56* (2013.01); *G03H 2260/63* (2013.01)

(58) Field of Classification Search
CPC ..... G03H 1/04; G03H 1/0402; G03H 1/0443; G03H 2001/0445; G03H 2001/0447; G03H 2001/045; G03H 2001/0452; G03H 1/08; G03H 1/0825; G03H 1/0866; G03H 1/0891; G03H 1/10; G03H 1/12; G03H 1/14; G03H 2210/11; G03H 2210/40; G03H 2240/13; G03H 2223/00; G03H 2223/12; G03H 2223/13
USPC ............................ 359/1, 9, 10, 11, 21, 32, 33
See application file for complete search history.

(56) References Cited

U.S. PATENT DOCUMENTS

| 8,542,421 | B2 * | 9/2013 | Rosen et al. | 359/9 |
| 2010/0142014 | A1 * | 6/2010 | Rosen et al. | 359/1 |
| 2011/0300490 | A1 * | 12/2011 | Rachet et al. | 430/322 |
| 2015/0185695 | A1 * | 7/2015 | Rakhovsky et al. | 359/9 |
| 2015/0185697 | A1 * | 7/2015 | Rakhovsky et al. | 359/9 |

* cited by examiner

*Primary Examiner* — William R Alexander
(74) *Attorney, Agent, or Firm* — TransPacific Law Group; Pavel I. Pogodin, Esq.

(57) ABSTRACT

The invention describes a method of manufacturing a holographic mask capable of producing an image pattern that contains elements of a subwavelength size along with decreased deviations from the original pattern. The original pattern is converted into a virtual electromagnetic field and is divided into a set of virtual cells with certain amplitudes and phases, which are mathematically processed for obtaining the virtual digital hologram. In the calculation of virtual components of the hologram, the method includes a step, wherein as a result of the preliminary divergence of the initial light beam, the entire virtual hologram is increased in proportion to the degree of the divergence of the initial light beam. This facilitate virtual processing of the fine and delicate elements of the virtual hologram. Upon completion of the virtual processing, the final data needed for manufacturing of the actual digital hologram, e.g., on a lithograph, are obtained.

19 Claims, 9 Drawing Sheets

METHOD OF MICROLITHOGRAPHY WITH THE USE OF DIVERGENT/CONVERGENT BEAMS FOR HOLOGRAPHIC RESTORATION OF AN IMAGE

CROSS REFERENCE TO RELATED PATENT APPLICATIONS

This patent application claims the benefit of priority to and is a continuation-in-part of U.S. patent application Ser. No. 14/142,776 filed on Dec. 28, 2013 by V. Rakhovsky (METHOD FOR SYNTHESIS AND FORMATION OF A DIGITAL HOLOGRAM FOR USE IN MICROLITHOGRAPHY), the entire disclosure of which is incorporated by reference herein.

BACKGROUND OF THE INVENTION

1. Field of the Invention

The invention relates to a method for synthesis and formation of a digital hologram for use in microlithography with a divergent beam in synthesis of the hologram and a convergent beam in image restoration from the hologram.

2. Description of the Related Art

Lithography and, in particular, photolithography is a well-known technique in semiconductor and printed circuit board (PCB) manufacture for creating electrical components and circuits. Photolithography involves placing a mask in front of a substrate, which has been covered by a layer of photoresist, before exposing both a mask and a substrate to light. The areas of photoresist that are exposed to light react and change chemical properties. The photoresist is then developed in order to remove either the exposed portions of photoresist for a positive resist or the unexposed portions for a negative resist. The pattern formed in the photoresist allows further processing of the substrate, such as, but not limited to, etching, deposition, or implantation.

Known in the art is an optical projection microlithography which is the technique that nowadays is most widely used and provide optimal parameters needed for production, e.g., of integrated circuits (IC). An alternative method is a holographic lithography which is based on image formation with the use of a special holographic mask and a laser beam of high coherency. Advantages and disadvantages of both methods are disclosed with more details, e.g., in U.S. patent application Ser. No. 14/142,776 filed on Dec. 28, 2013 by V. Rakhovsky.

U.S. patent application Ser. No. 14/142,776 discloses a method of manufacturing a holographic mask capable of producing an image pattern that contains elements of a sub-wavelength size along with decreased deviations from the original pattern. The original pattern is converted into a virtual electromagnetic field and is divided into a set of virtual cells with certain amplitudes and phases, which are mathematically processed for obtaining the virtual digital hologram. The calculation of the latter is based on parameters of the restoration wave, which is used to produce the image pattern from the mask, and on computer optimization by variation of amplitudes and phases of the set of virtual cells and/or parameters of the virtual digital hologram for reaching a satisfactory matching between the produced image pattern and the original pattern. The obtained virtual digital hologram provides physical parameters of the actual digital hologram that is to be manufactured.

However, U.S. patent application Ser. No. 14/142,776 does not teach how to synthesize the hologram and restoration of an image from the hologram with reference to the shape of the light beams used in virtual and actual manipulations of the optical beams, especially under conditions when the features of the hologram mask are too small for patterning and therefore are beyond the technological abilities of the conventional methods.

SUMMARY OF THE INVENTION

The present invention relates to the semiconductor industry, in particular to a method for synthesizing a holographic photomask used for reconstructing the images with very fine and delicate elements of the pattern which cannot be processed, formed, and reproduced without enlargement suitable for microlithography processes. It is important to note that in the method of synthesis of the hologram the virtual original illumination light beam is diverged, while the virtual restoration wave beam is converged.

More specifically, among other steps of the synthesis, the method includes the step of passing the light of a flat light beam of a first virtual light wave that has a given phase and amplitude, which are changed individually in each first virtual unit cell when the first virtual light wave FVLW passes through this cell, whereby a plurality of first individual virtual light sources selected from the group of point light sources and/or extended light sources is formed, and wherein each first individual virtual light source of said plurality acquires a precalculated phase and amplitude. It is well known, what flat wave diffraction on the small features diverges. The smaller feature size, the wider angle of diffraction. Moreover, if where is dense group of small features with alternating phase, the diffraction angle is getting even wider. Therefore, after diffraction on first virtual unit cells plurality FVLW becomes divergent with aperture angle dependent on image elements size, their mutual disposition and phases distribution.

In the calculation of virtual components of the hologram, the method includes steps, wherein as a result of the preliminary divergence of the diffracted initial light beam, the entire virtual hologram is increased in proportion to the degree of the divergence of the diffracted initial light beam. This facilitates virtual processing of the fine and delicate elements of the virtual hologram. Upon completion of the virtual processing, the final data needed for manufacturing of the actual digital hologram, e.g., on a lithograph, are obtained.

Additional aspects related to the invention will be set forth in part in the description which follows, and in part will be obvious from the description, or may be learned by practice of the invention. Aspects of the invention may be realized and attained by means of the elements and combinations of various elements and aspects particularly pointed out in the following detailed description and the appended claims.

It is to be understood that both the foregoing and the following descriptions are exemplary and explanatory only and are not intended to limit the claimed invention or application thereof in any manner whatsoever.

BRIEF DESCRIPTION OF THE DRAWINGS

The accompanying drawings, which are incorporated in and constitute a part of this specification exemplify the embodiments of the present invention and, together with the description, serve to explain and illustrate principles of the inventive technique. Specifically.

DETAILED DESCRIPTION

Figure 1B:
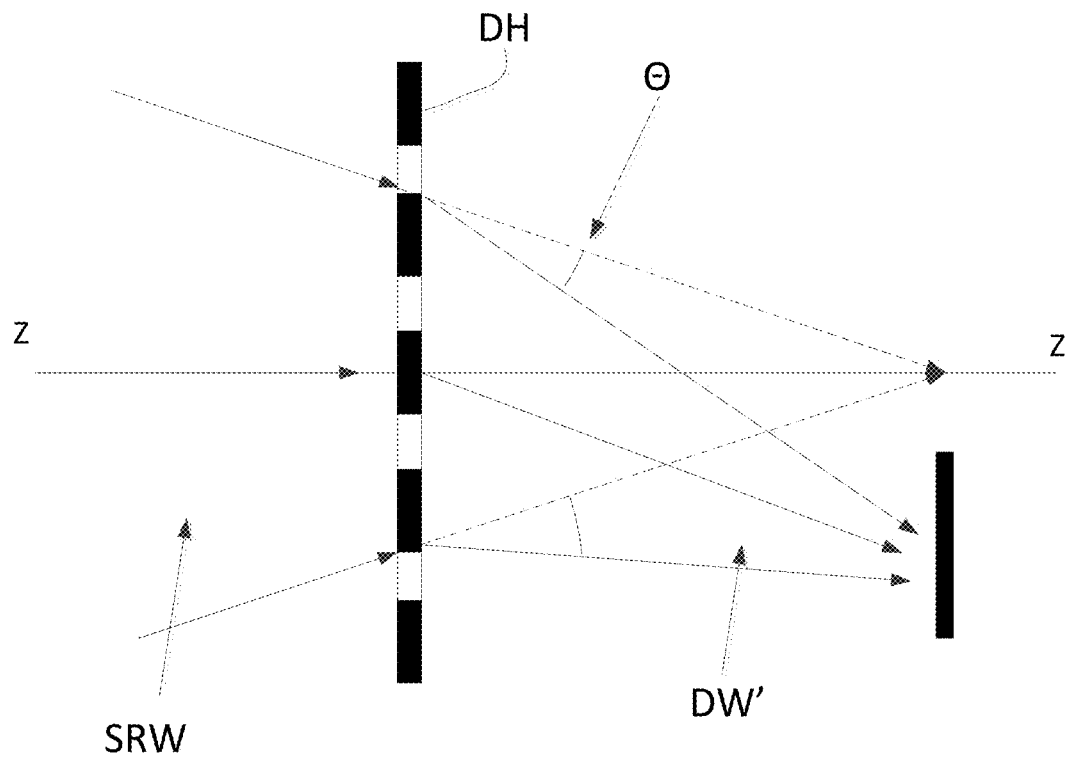
FIGS. 1A and 1B are graphs illustrating variation of diffraction angles in case of a planar reference wave a spherical reference waves, respectively.

In the following detailed description, reference will be made to the accompanying drawing(s), in which identical functional elements are designated with like numerals. The aforementioned accompanying drawings show by way of illustration, and not by way of limitation, specific embodiments and implementations consistent with principles of the present invention. These implementations are described in sufficient detail to enable those skilled in the art to practice the invention and it is to be understood that other implementations may be utilized and that structural changes and/or substitutions of various elements may be made without departing from the scope and spirit of present invention. The following detailed description is, therefore, not to be construed in a limited sense.

The present invention is a further improvement of the method for synthesis and formation of a digital hologram by employing a divergent beam in synthesis of the hologram and a convergent beam in image restoration from the hologram. For better understanding of the principle of the invention, let us first consider this concept in more detail.

The key elements of a holographic optical circuit are an object, a reference beam, a restoration beam, and a hologram. The idea of holography can be briefly described as follows: an object illumination wave interferes with the reference beam and records the information on the hologram. Then the restoration beam, which is a reversed reference beam, passes through the recorded hologram. As a result of the diffraction, an image of the object appears on the hologram on the area intended for such an image. Later, this information is used in the manufacture of an actual hologram.

Various holographic optical schemes differ from each other by arrangements, mutual positions, and types of reference and restoration beams. In the fundamental works on holography In the fundamental works on holography [E. N. Leith and J. Upatnieks, "Reconstructed wavefronts and communication theory," J. Opt. Soc. Amer. 52, pp. 1123-30 (1962); E. N. Leith and J. Upatnieks; "Wavefront reconstruction with continuous-tone objects, Opt. Soc. Amer. 53, pp. 1377-81 (1963)" J D. Gabor, "Microscopy by Reconstructed Wave-Fronts"], planar and paraxial waves are used as a reference and restoration waves. As a result of further investigation of the idea of holography schemes have been developed with reference and restoration waves of other types [J. Goodman, "Introduction to Fourier Optics"; A. W. Lohmann and D. P. Paris, "Binary Fraunhofer Holograms, Generated by Computer"].

At the present time, the most promising in the field of producing quality high-resolution images of a relatively large size are schemes with a transmission holograms in the zone of the Fraunhofer diffraction with spherical reference and restoration waves (lensless Fourier holograms). One of the main advantages of the spherical wave over a flat restoration wave is a possibility of separating a useful image from the zero-order diffraction. Of course, is not possible to obtain high contrast images on the background of the zero-order diffraction, and in the case of plane wave illumination occurrence of the background is inevitable.

Let us consider another important advantage of a spherical wave. When recording holograms of extended objects the diffractive angles between the interfering wave illuminating the object and the plane reference wave incident on the hologram grows fast and can be substantially large. Therefore, the interference pattern formed on the hologram is very small and its sampling requires selecting a fairly fine grid which is at a limit of its physical realization. In other words, wavefront of the initial light beam diffracted on the object is close to spherical, therefore interference pattern of latter with plane or paraxial beam has too large spatial frequency. To obtain low spatial frequency interference pattern which can be produced, it is necessary to choose beam with wavefront close to that of wave illuminating the object. Spherical wave with focus close to the object fits these requirements well. Waves with fronts, slightly different from described above, may be used as well. Amplitude distribution can be spherical, or subjected to additional modulation, like Gaussian.

It is known that in some areas of hologram of a sufficiently large size image, the period of change in the function of the amplitude (phase) modulation of transmission will not exceed 3λ. This means that the cell size of the hologram will not exceed 1.5λ, and the size of the holes after binarization are even smaller. This is unacceptable because of the impossibility of applying Kirchhoff approximation for such holes. Holes having the size of a half-wavelength or less do not pass light at all (as mentioned in U.S. patent application Ser. No. 14/142,776, the actual digital hologram (ADH) is made in the form of a set of holes formed in a nontransparent layer).

Figure 1A:
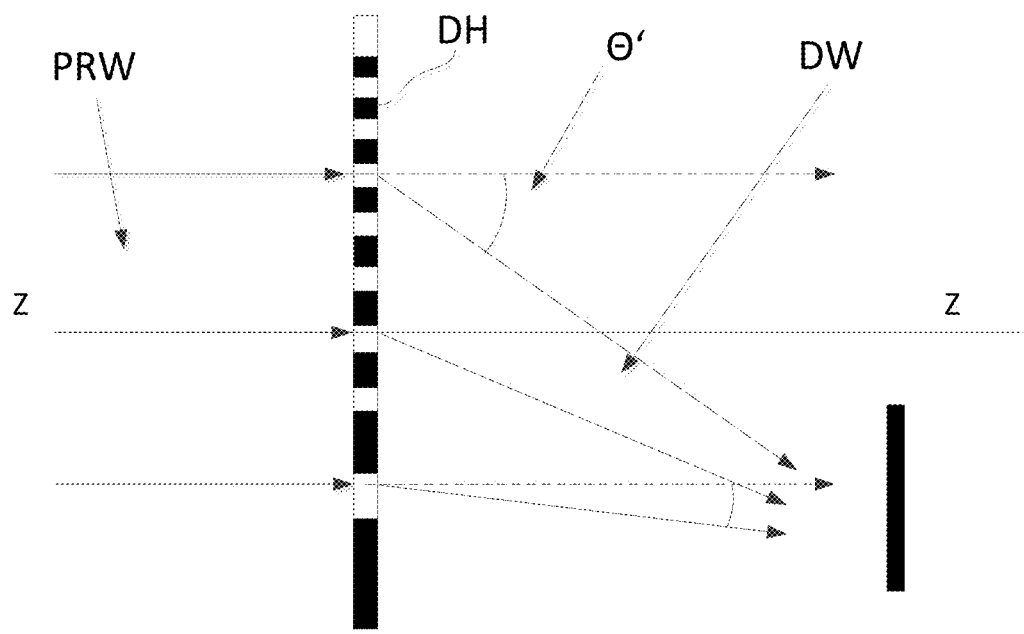

Variation of diffraction angles in case of a) a planar reference wave and b) a spherical reference wave are shown in FIGS. 1A and 1B. FIG. 1A shows that after passing through the digital hologram DH the planar reference wave PRW is transformed into a wave DW, which is deviated from the optical axis Z-Z for a certain angle θ. FIG. 1B shows that after passing through the hologram the spherical reference wave SRW is transformed into a wave DW', which is deviated from the optical axis Z-Z for a certain angle θ'. In case of a spherical reference wave, diffraction angles change to a lesser degree and reach their maximum close to the center of the hologram DH.

Evaluation of the period of the velocity function oscillation on a hologram in the case of a spherical wave is known:

$$T \geq \lambda d / \Delta x,$$

where $\Delta x$ is an image size, and d is a distance to the hologram.

For sufficiently accurate transmission of the grey function in the hologram, it may be required that during binarization the oscillation period could cover several steps of the net.

For a relatively slow oscillation of the transmission function on the hologram, the latter should be shifted away from the image at a distance of about $\Delta x$. In other words, an about 10 cm distance may be required for obtaining a 1 cm image. For comparison, in case of obtaining a relatively small image with the use of a planar wave, it was necessary to move the hologram for a distance of 1.2 meters. [Neto, L G; Cardona, P. S. P.; Cirino, G. A.; Mansano, R D & Verdonck, P. (2004), <<Implementation of Fresnel full complex-amplitude digital holograms>>].

However, the published literature and patents do not contain any information about the front of the restoration wave in connection with the holographic methods of lithography.

Based on the principled described above, the applicants of the present application have improved the method for synthesis and formation of a digital hologram for use in microlithography and provided a method for synthesis and formation of a digital hologram for use in microlithography with a divergent beam in synthesis of the hologram and a convergent beam in image restoration from the hologram. Thus the applicants arrived at the present invention.

In order to understand the principle of the present invention, it is advisable first to more clearly understand and formulate the problem that must be solved by the proposed method. It should be noted that in spite of the fact that the problem of synthesis of a holographic mask is a major one for use in holographic photolithography, it is a very specific one from the point of view of holography as a whole.

An endless amount of methods for mathematical synthesis of approximation to a holographic pattern exists. Some of these methods are presented in patent publications listed above. Furthermore, these methods differ from each other in details. However, the majority of these methods do not allow calculation of a holographic pattern for a time acceptable for practical industrial application because even an insignificant increase in pattern dimensions leads to a catastrophic increase in computing power. That is why until now, in spite of attractiveness of the aforementioned methods, they did not find practical application.

The method of the invention for holographic synthesis of digital holograms for use in microlithography proposed by the inventors decreases synthesis time by a factor of 10 or greater.

The method of the invention is described in more detail below in the form of sequential steps designated in alphabetic order.

Figure 1C:
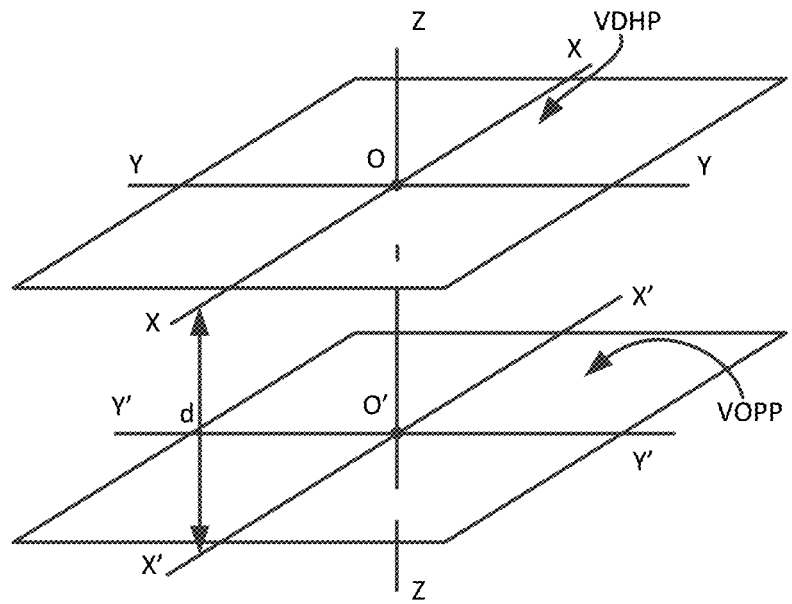
FIG. 1C is a perspective view of relative positions of a virtual hologram plane (VDHP) and a virtual original pattern plane in an X, Y, Z coordinate system.

The first step (a) consists of introducing an orthogonal coordinate system x, y, z having three mutually perpendicular axes X-X, Y-Y, and Z-Z, choosing a point O (see FIG. 1C) on the axis Z-Z, and passing through this point O a virtual digital hologram plane (VDHP), which is perpendicular to the axis Z-Z and which is to be used as a plane of a virtual digital hologram (VDH) for assisting in manufacture of the actual digital hologram (not shown in FIG. 1C).

The next step (b) consists of selecting an orthogonal coordinate system x', y', z having three mutually perpendicular axes X'-X', Y'-Y', and Z-Z, choosing a point O' on the axis Z-Z, which is spaced from the virtual digital hologram plane (VDHP) at a certain distance "d", and passing through this point O' a virtual original pattern plane (VOPP), which contains a virtual original pattern and is perpendicular to said arbitrary axis Z-Z, and wherein the virtual original pattern that contains image elements is to be used for subsequent synthesis of the virtual digital hologram.

Figure 2:
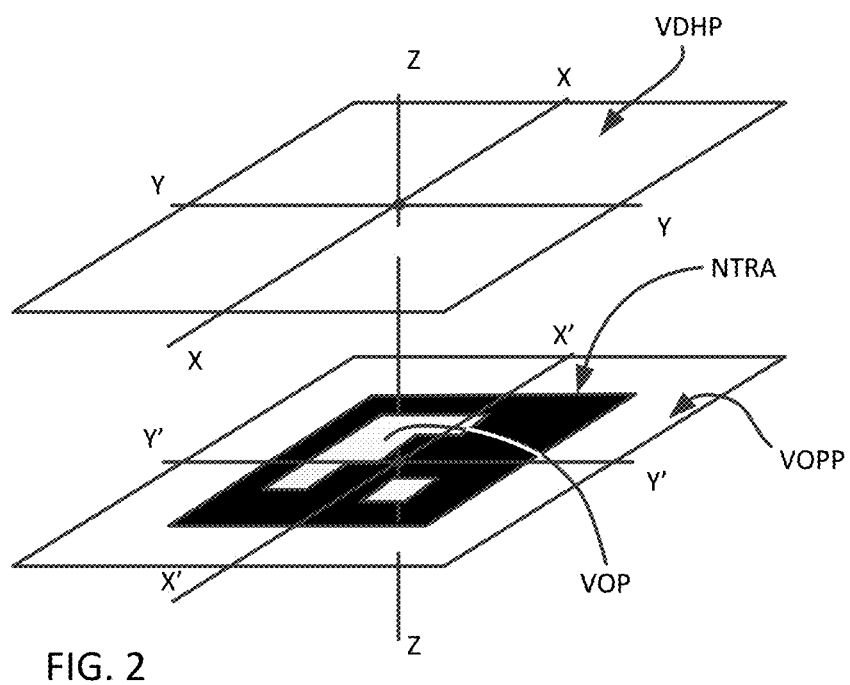
FIG. 2 is a perspective view of the position of a nontransparent restricted area (NTRA) in the virtual original pattern plane (VOPP) and position of the virtual original pattern (VOP) in the nontransparent restricted area (NTRA) of the virtual original pattern plane (VOPP).

The next step (c), which is shown in FIG. 2, consists of selecting a nontransparent restricted area (NTRA) in the virtual original pattern plane (VOPP) and placing the virtual original pattern (VOP) in the nontransparent restricted area (NTRA) of the virtual original pattern plane (VOPP). The virtual original pattern (VOP) is formed by virtual image elements (VIE).

Figure 3:
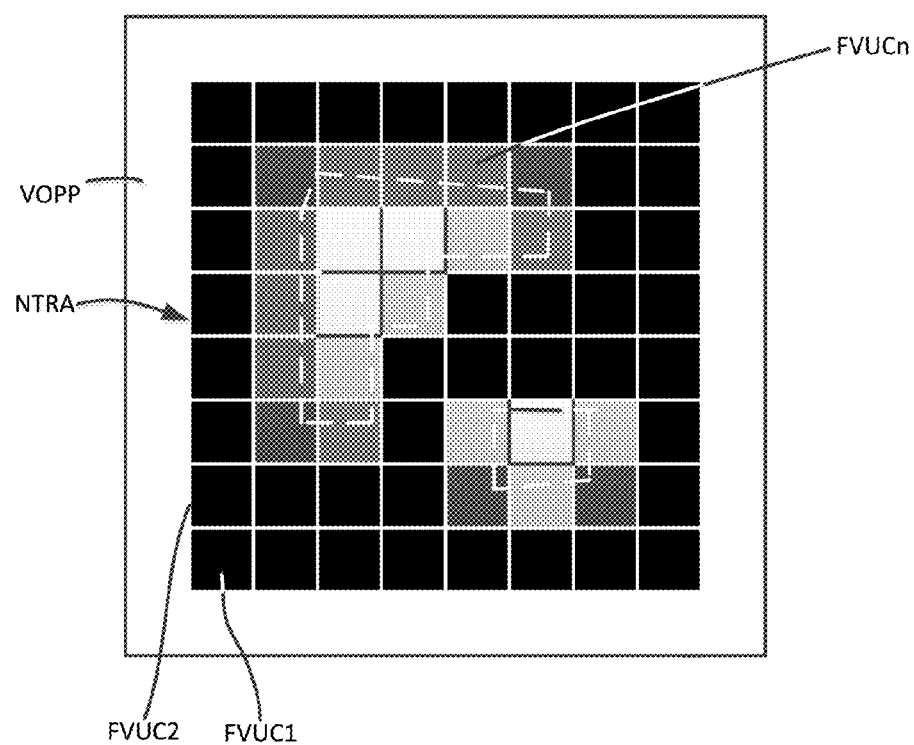
FIG. 3 is a top view of a step in which the first virtual net (FVN), which divides the nontransparent restricted area (NTRA) into a plurality of first virtual unit cells (FVUC1, FVUC2, . . . FVUCm), is applied onto the virtual original pattern plane (VOPP).

In the next step (d), which is shown in FIG. 3, a first virtual net (FVN), which divides the nontransparent restricted area (NTRA) into a plurality of first virtual unit cells (FVUC1, FVUC2, ... FVUCm), is applied onto the virtual original pattern plane (VOPP).

In the next step (e), the first virtual unit cells (FVUC1, FVUC2, ... FVUCm) are classified into white first virtual unit cells such as a first white virtual unit cell (WFUC), black first virtual unit cells such as (BFUC), and grey first virtual unit cells such as (GFUC) (FIG. 3), wherein a white first virtual unit cell is obtained if a first virtual unit cell of the first net overlaps the virtual image elements of the original pattern, a black first virtual unit cell is obtained if a first virtual unit cell of the first net overlaps only a space between the adjacent virtual image elements, and a grey virtual unit cell is obtained if a first virtual unit cell of the first net overlaps both virtual image elements and a space between adjacent virtual image elements.

Figure 4:
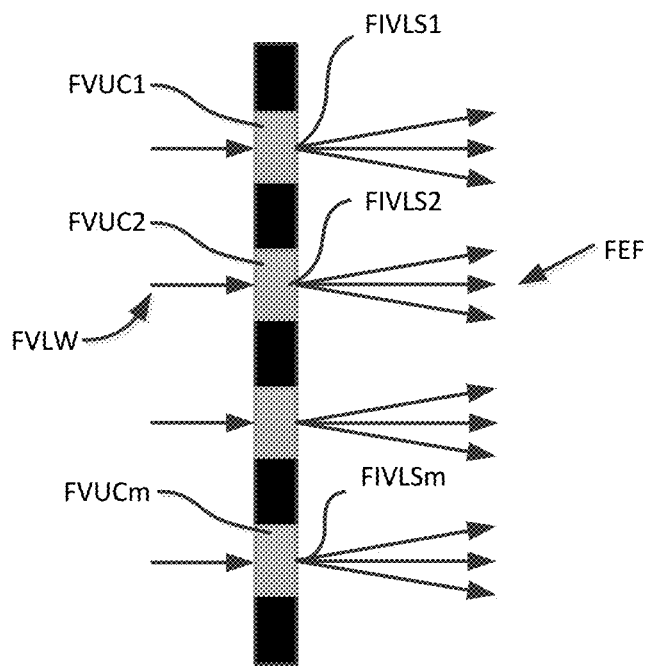
FIG. 4 is a side view showing passage of the first virtual light wave (FVLW) through the first virtual unit cells.

The next step (f) consists of presenting the virtual original pattern (VOP) in the form of a virtual digital amplitude-phase mask, wherein each first virtual unit cell is assigned a transmission value, wherein white first virtual unit cells (WFUC) are assigned a transmission value of 1.0, black first virtual unit cells (BFUC) are assigned a transmission value of 0.0, and grey first virtual unit cells (GFUC) are assigned a transmission value in the range of 0.0 to 1.0; all areas beyond the restricted area are assigned an amplitude value of 0.0; and wherein each first virtual unit cell has a function of a rotational phase shifter for shifting the phase in each respective first virtual unit cell when this first virtual unit cell passes a diverged light beam of a first virtual light wave (FVLW) (FIG. 4) that has a given phase, amplitude and directional characteristic, which are changed individually in each first virtual unit cell when the first virtual light wave (FVLW) passes through this cell, whereby a plurality of first individual virtual light sources (FIVLS1, FIVLS2, . . . FIVLSm) selected from the group of point light sources and/or extended light sources is formed, wherein each first individual virtual light source of said plurality acquires a precalculated phase, amplitude and directional characteristic.

In the next step (g), an auxiliary correction of said acquired precalculated phase, amplitude and directional characteristic is performed for each first individual virtual light source of said plurality for obtaining a post-calculated distribution of said phase, amplitude and directional characteristic of the first individual virtual light sources (FIVLS1, FIVLS2, . . . FIVLSm) of said plurality.

The next step (h) consists of fixing the obtained post-calculated distribution of said phase, amplitude and directional characteristic of the first individual virtual light sources (FIVLS1, FIVLS2, . . . FIVLSm) of said plurality, said first individual virtual light sources (FIVLS1, FIVLS2, . . . FIVLSm) generating a first electromagnetic field (FEF) in the virtual original pattern plane (VOPP).

In the next step (i), a second virtual net that divides the plane of a virtual digital hologram into a plurality of second virtual unit cells is applied onto the plane of the virtual digital hologram. This step is not illustrated because it looks similar to one shown in FIG. 3. In the second virtual unit cells of the virtual digital hologram plane (VDHP), the first light sources of said plurality generate a second electromagnetic field (SEF). However, an image pattern of the entire virtual hologram will be increased from the dimensions of the original virtual pattern proportionally to the divergence of the aforementioned divergent light beam of the first virtual light wave (FVLW).

The step (j) consists of calculating amplitude and phase of the second electromagnetic field (SEF) in the virtual digital hologram plane (VDHP) from the first light sources of said plurality.

Figure 5:
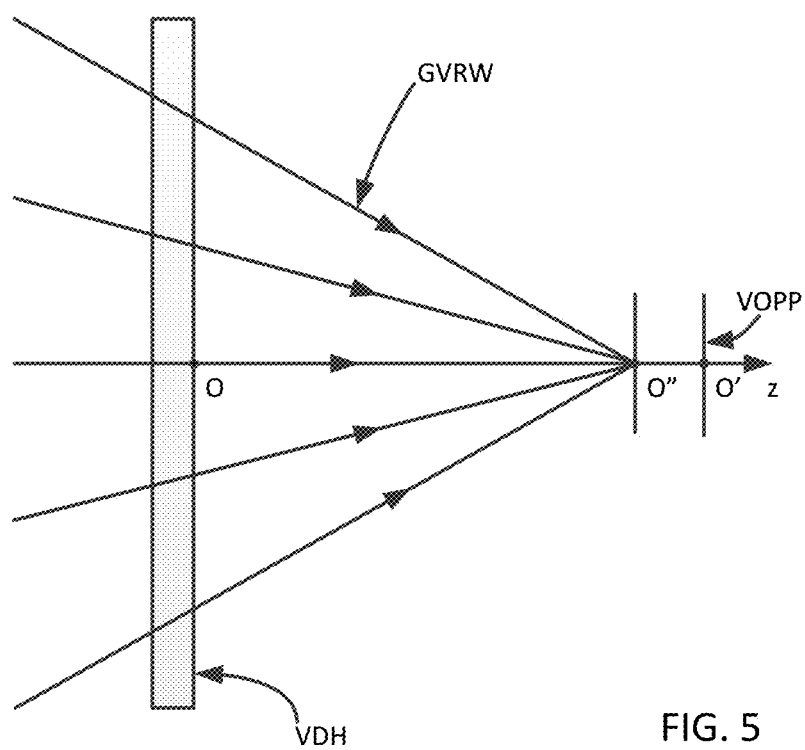
FIG. 5 is a side view that shows passage of a given virtual restoration wave ((GVRW)) through the virtual digital hologram for subsequent restoration of a final virtual image (FVI).

The next step (k), which is shown in FIG. 5, consists of providing a given virtual restoration wave (GVRW) for subsequent restoration of a final virtual image FVI. This given virtual restoration wave (GVRW) should be complex conjugated to the first virtual light wave FVLW.

The drawing shows that the given virtual restoration wave (GVRW) propagates in the direction from (VDHP) to (VOPP) and comprises a spherical or near-spherical wave (or, in a general case, a nonspherical wave) that converges to point O", which may or may not coincide with point O' on the virtual original pattern plane (VOPP). Designations (VDH), (VOPP), O, O', and z are the same as in FIG. 1C.

Figure 6:
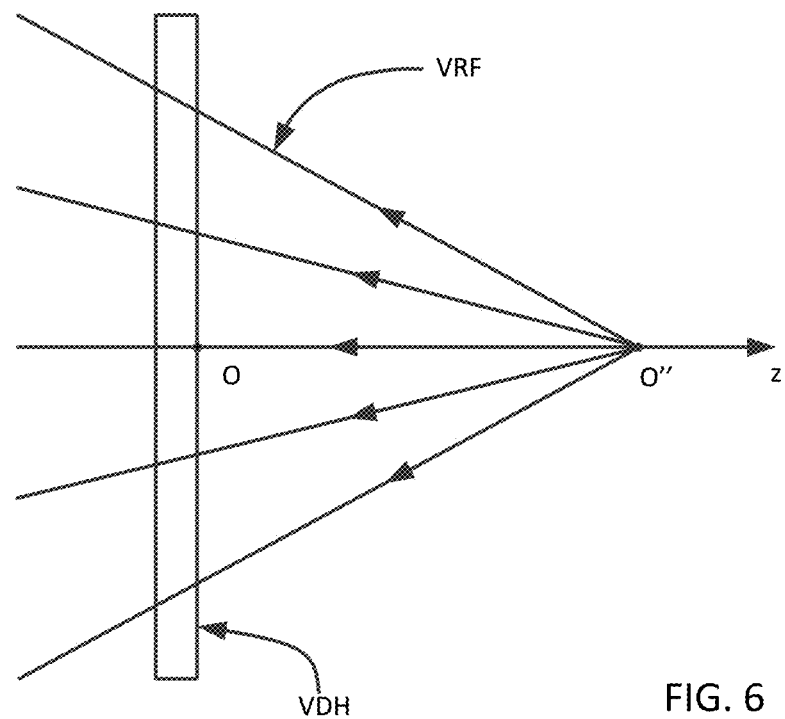
FIG. 6 is a side view that shows inversion of the given virtual restoration wave ((GVRW)) into a virtual reference wave (VRF) to be used for calculating the virtual digital hologram (VDH).

The next step (l) (FIG. 6) is inverting the given virtual restoration wave (GVRW) into a virtual reference wave (VRF) to be used for calculating the virtual digital hologram (VDH).

Figure 7:
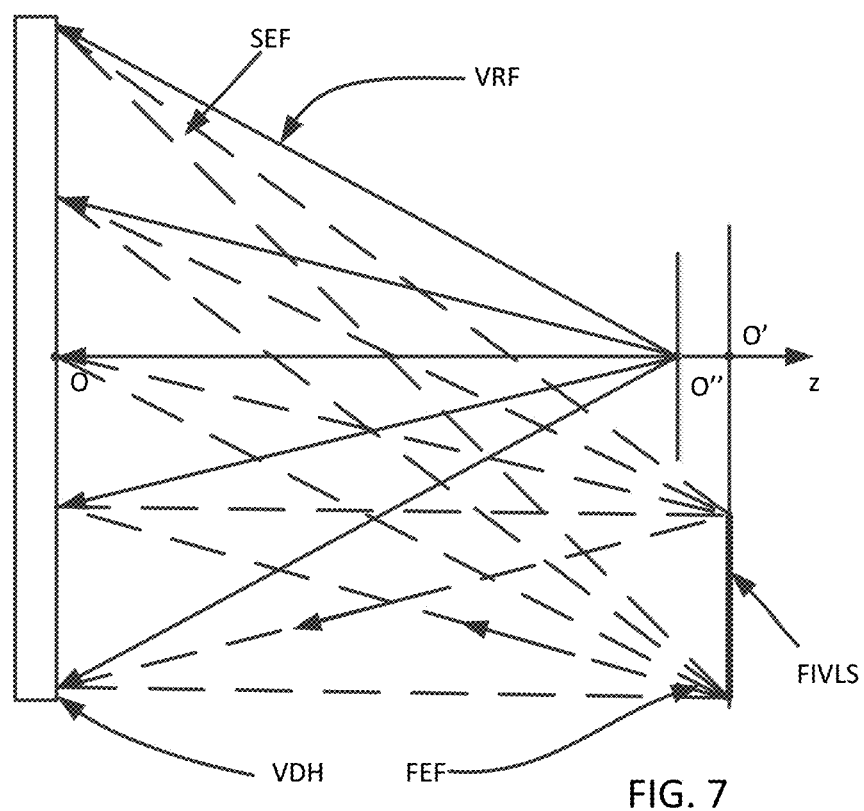
FIG. 7 is a side view that shows an addition of the virtual reference wave (VRF) to the second electromagnetic field (SEF) obtained in the second virtual unit cells.

In the next step (m), the virtual reference wave (VRF) is added to the second electromagnetic field (SEF) obtained in the second virtual unit cells for calculating interference amplitudes and phases obtained as a result of interference of the second electromagnetic field (SEF) obtained from the first virtual light sources with the virtual reference wave VRF. This is shown in FIG. 7. This drawing illustrates a case wherein point O" is in the virtual original pattern plane (VOPP).

The next step (n) consists of calculating the values of the virtual digital hologram (VDH) in the second virtual unit cells based on the interference amplitudes and phases in each second virtual unit cell.

Figure 8:
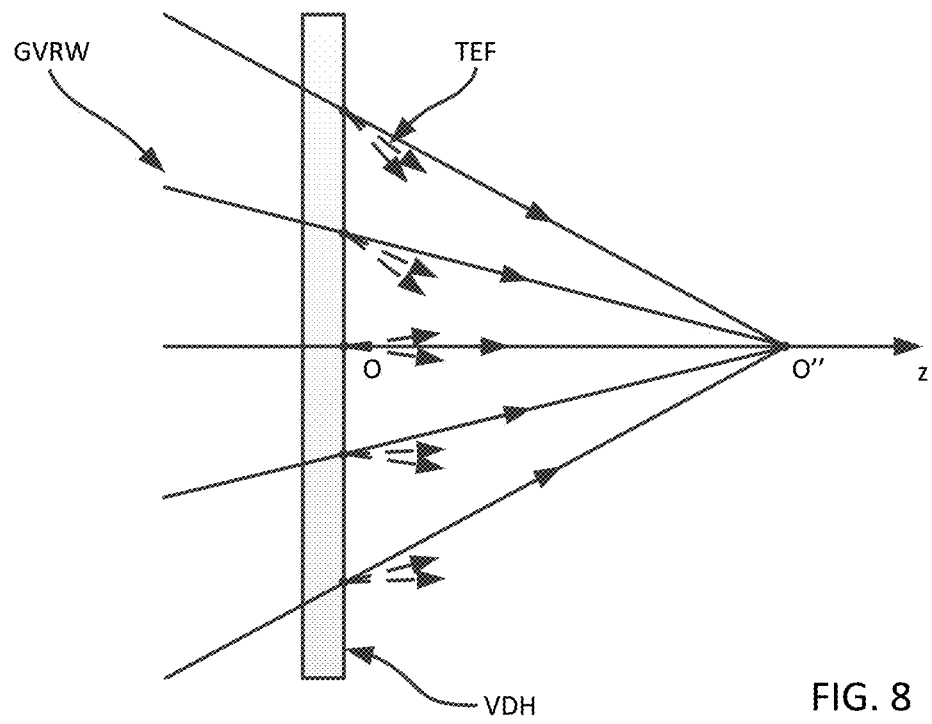
FIG. 8 is a side view that shows passage of a given virtual restoration wave ((GVRW)) through the virtual digital hologram plane (VDHP) for forming a plurality of second individual virtual light sources in the second virtual unit cells.

Next, in step (o) (FIG. 8), the given virtual restoration wave (GVRW) passes through the virtual digital hologram plane (VDHP), thus forming a plurality of second individual virtual light sources (SIVLS1, SIVLS2, . . . SIVLSk) in the second virtual unit cells. The second individual virtual light sources (SIVLS1, SIVLS2, . . . SIVLSk) generate a third electromagnetic field (TEF) in the virtual digital hologram plane (VDHP).

In step (p), a final virtual image plane (FVIP) is selected for subsequent formation of the final virtual image. This plane may or may not coincide with the virtual original pattern plane (VOPP).

The next step (q) consists of applying a third virtual net onto final virtual image plane (FVIP), whereby a plurality of third virtual unit cells is formed. (This step is not illustrated because it is similar to one shown in FIG. 3). In the third virtual unit cells, the second individual light sources (SIVLS1, SIVLS2 . . . SIVLSk) generate a fourth electromagnetic field (REF).

Figure 9:
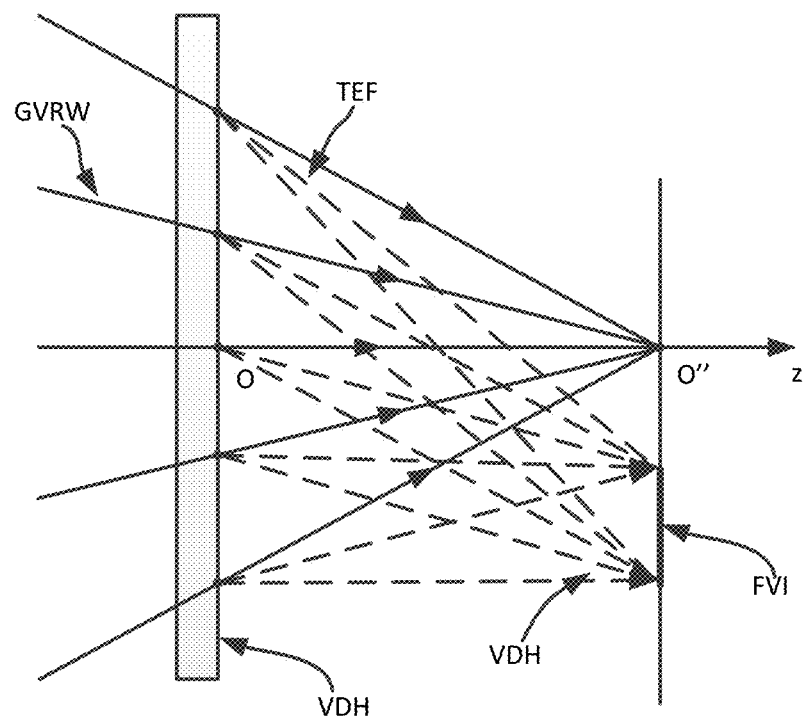
FIG. 9 is a side view of a step at which amplitudes and phases of the fourth electromagnetic field (REF) are calculated.

Step (r), which is shown in FIG. 9, consists of calculating amplitudes and phases of the fourth electromagnetic field (REF). This drawing illustrates a case wherein point O" is in the final virtual image plane.

Figure 10:
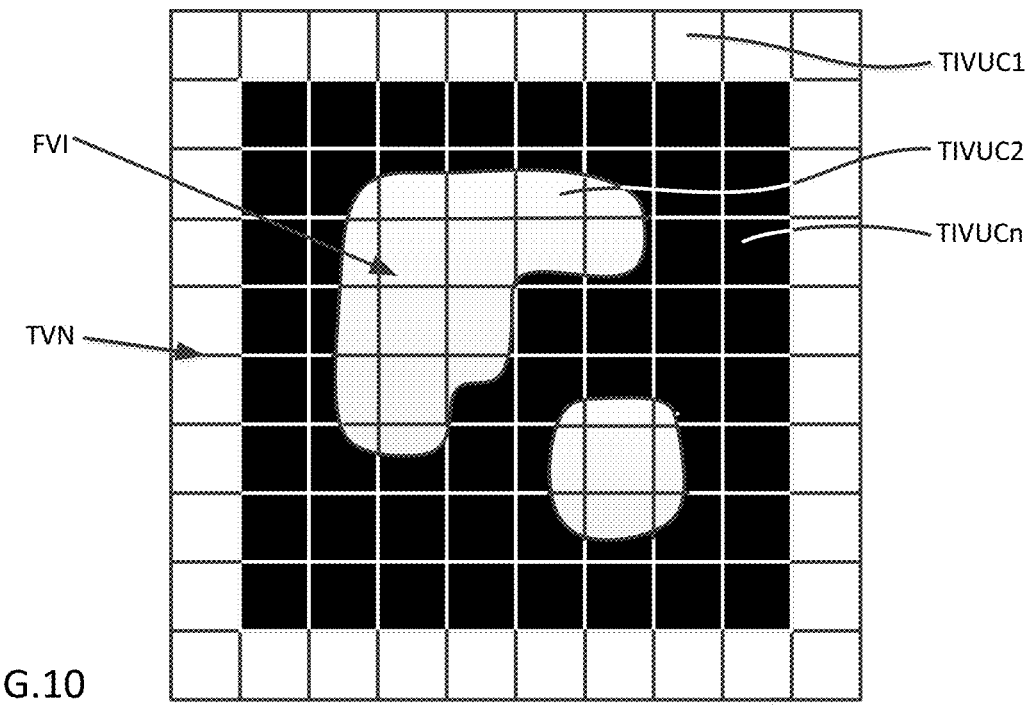
FIG. 10 is a plan view illustrating results of the step in the values of the final virtual image (FVI) are calculated in the third virtual unit cells based on amplitudes and phases of the fourth electromagnetic field (REF).

Step (s), which is shown in FIG. 10, consists of calculating the values of the final virtual image FVI in the third virtual unit cells (TIVUC1, TIVUC2, . . . TIVUCn) based on amplitudes and phases of the fourth electromagnetic field (REF) calculated in step (r).

Figure 11:
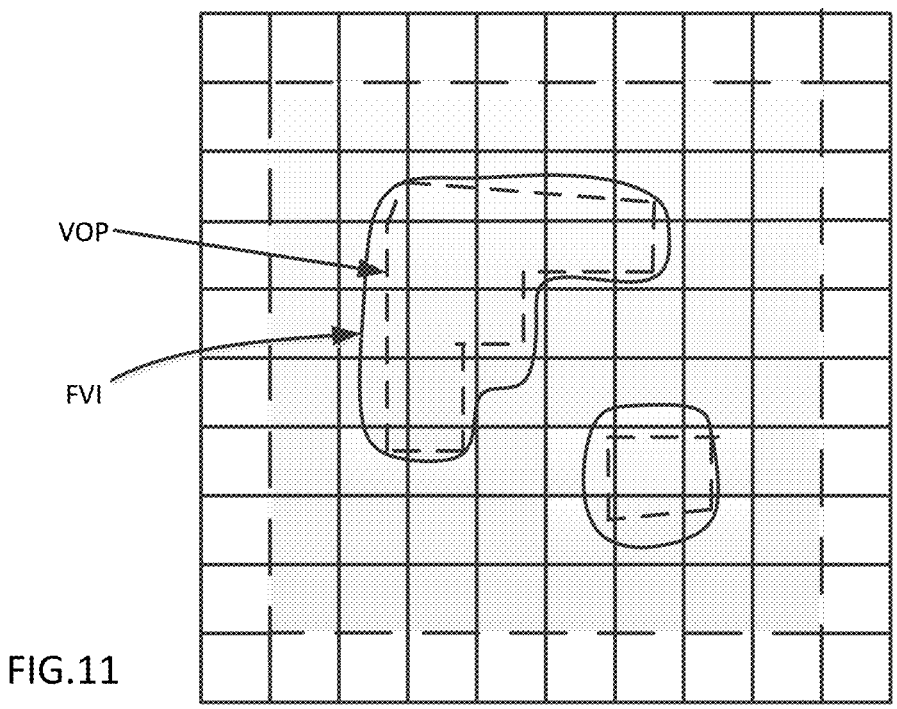
FIG. 11 illustrates introduction of a criterion for comparing the final virtual image (FVI) and the virtual original pattern (VOP).

Step (t) consists of introducing a criterion for matching the final virtual image (FVI) and the virtual original pattern (VOP) (FIG. 11).

In step (u) the final virtual image (FVI) is compared with the virtual original pattern (VOP) (FIG. 11) based on the criterion of matching if deviations are obtained.

Step (v) is minimizing the above deviation, if any, by repeating steps (g), (h), (j), (m), (n), (o), (r), (s), and (u) until a satisfactory value of the criterion of matching is achieved, thus obtaining the final virtual digital hologram.

Figure 12:
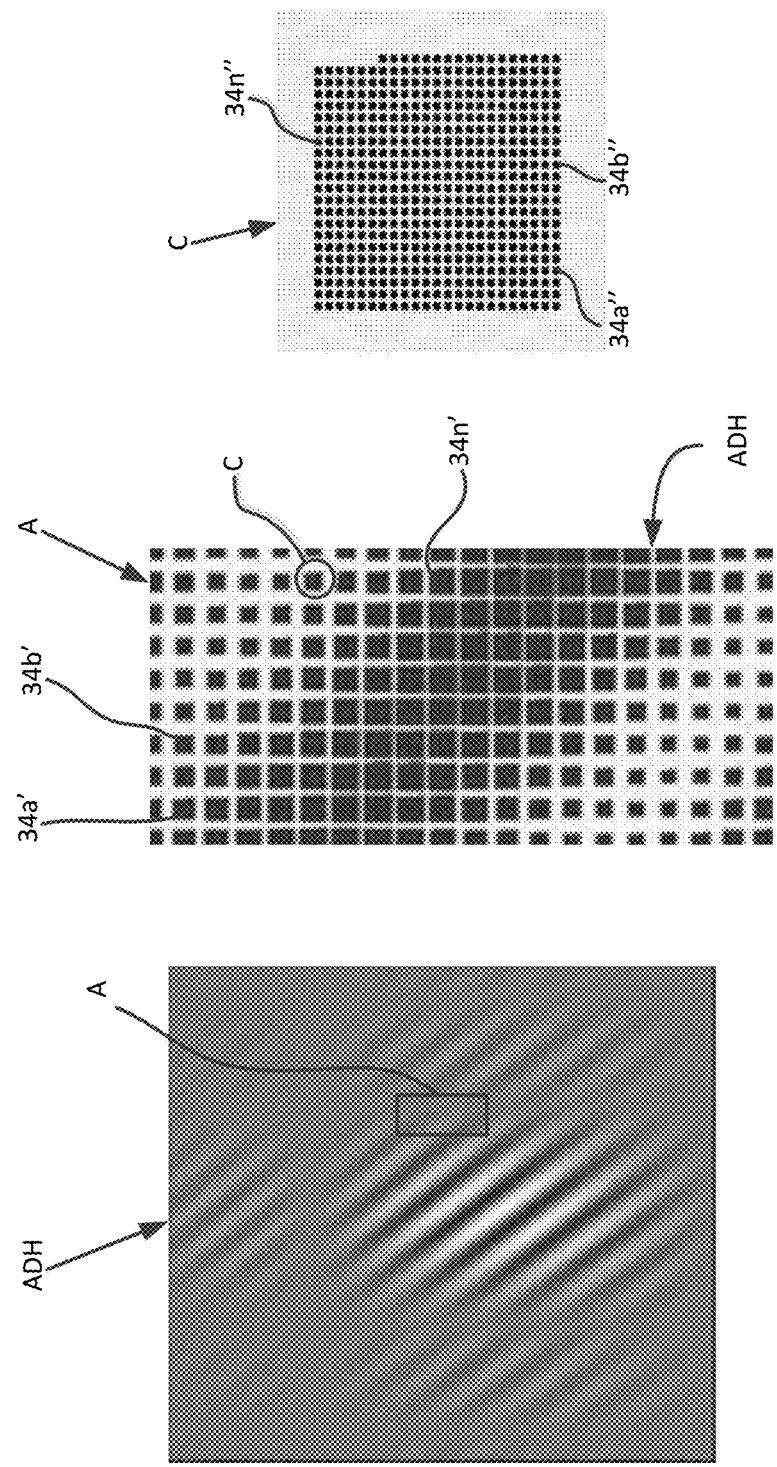
FIG. 12A is a top view of an actual digital hologram.
FIG. 12B is a top view of a rectangular area A marked in FIG. 12A that shows a plurality of holes of different dimensions formed in the nontransparent layer described in connection with FIG. 13.
FIG. 12C is a top view of an area C marked in FIG. 12B shown on a larger scale.

The final step (w) consists of manufacturing the actual digital hologram (ADH) on a hologram manufacturing apparatus (not shown) based on the final virtual digital hologram. FIG. 12A is a top view of an actual digital hologram (ADH). FIG. 12B is an enlarged picture of the rectangular area A marked in FIG. 12A. Based on the steps (f) to (j) described above, the image of the final virtual digital hologram will be much greater than the virtual original pattern and this will facilitate the manufacturing process.

According to one or several aspects of the invention, the electromagnetic field generated by the plurality of the first individual virtual light sources (FIVLS1, FIVLS2, . . . FIVLSm) in a certain plane, which is spaced at a certain distance from the plane (VOPP), can be expressed in a scalar approximation by formula (1):

$$u(x, y, z) = \int_{-\infty}^{\infty}\int_{-\infty}^{\infty} V(x', y')G(x-x', y-y', z)\,dx'\,dy' \quad (1)$$

where:

V(x',y') is an electromagnetic field in the (VOPP) plane (in other words, the distribution of phases and amplitudes of this electromagnetic field is equivalent to those of the first individual virtual light sources (FIVLS1, FIVLS2, . . . , FIVLSm), themselves).

$$G(x, y, z) = -\frac{\partial}{\partial z}\left(\frac{e^{ikr}}{2\pi r}\right);$$

where:

$r=\sqrt{x^2+y^2+z^2}$, and k is a wave number equal to $2\pi/\lambda$.

In the case illustrated in FIGS. 1 to 3, the aforementioned certain plane is the virtual digital hologram plane (VDHP) that is spaced from the virtual original pattern plane (VOPP) at distance d.

Therefore, formula (1) can be written as follows:

$$U(x, y) = \int\int_S V(x', y')G(x-x', y-y', d)dx'dy' \quad (2)$$

where:

S is the nontransparent restricted area (NTRA) shown in FIG. 2.

According to another aspect of the invention, numerical calculation of the amplitude and phase in the second virtual unit cells is carried out based on the fast Fourier transform.

According to one or several aspects of the invention, in the formation of the final actual virtual image (FAIFVI), the aforementioned given virtual restoration wave is identical to the actual restoration wave (ARW), which is used to illuminate the actual digital hologram (ADH) and to obtain the final actual image (FAI).

Figure 13:
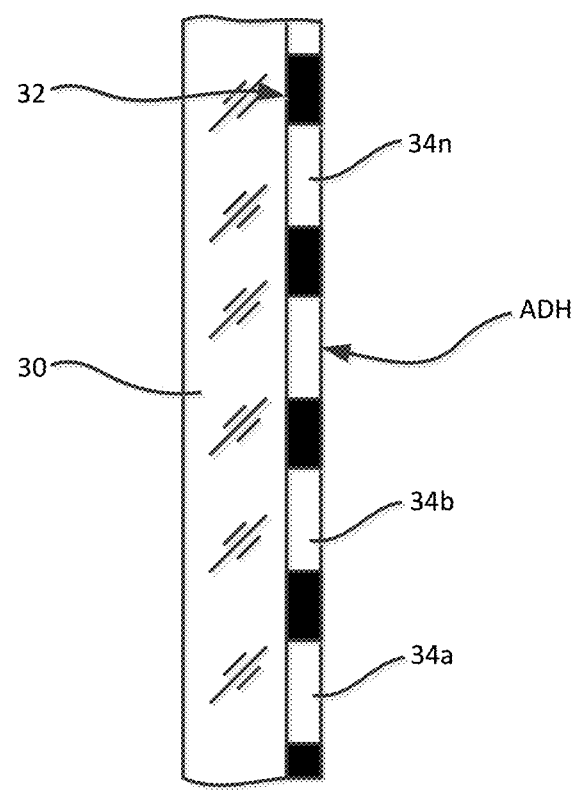
FIG. 13 is a sectional view of the final actual hologram with a set of holes of equal dimensions formed in the nontransparent layer for changing the amplitude of the actual restoration wave.

The actual digital hologram (ADH) is made in the form of a set of holes formed in a nontransparent layer. This is shown in FIG. 13, which is a fragment of a cross section through the actual digital hologram. In this drawing, reference numeral 30 designates a transparent substrate made, e.g., from fused silica (quartz), reference numeral 32 designates a nontransparent layer applied onto the transparent layer 30, and reference numerals 34a, 34b, . . . 34n designate holes made in the nontransparent layer 32.

As shown in FIG. 12B, the actual digital hologram (ADH) can be made in the form of a set of holes 34a', 34b', . . . 34n' of a variable size formed in a nontransparent layer 32', where one such hole of a predetermined size corresponds to an appropriate second virtual unit cell of the virtual digital hologram.

FIG. 12C is a top view of an area C marked in FIG. 12B shown on a larger scale. In the illustrated case the area C of FIG. 12B comprises a single unit cell of the ADH that corresponds to one of the second virtual unit cells mentioned in step i) of the method of the invention. This cell contains "n" holes such a hole 34a", 34b", . . . 34n". In fact, the number of the hole may vary from 1 to "n" or greater.

Although the invention has been shown and described with reference to specific embodiments, it is understood that these embodiments should not be construed as limiting the areas of application of the invention and that any changes and modifications are possible, provided that these changes and modifications do not depart from the scope of the attached patent claims. Thus, the following criteria can be used for evaluating the level of matching of the final virtual image (FVI) to the virtual original pattern (VOP): a maximal difference of intensities or amplitudes in the unit cells that coincide in coordinates of the virtual original pattern (VOP) and the final virtual image (FVI); a sum of absolute differences in (a) intensities or (b) amplitudes of all cells of virtual original pattern (VOP) and the final virtual image (FVI); a sum of squared differences in (a) intensities or (b) amplitudes of all cells of virtual original pattern (VOP) and the final virtual image (FVI); a sum of arbitrary degree differences in (a) intensities or (b) amplitudes of all cells of virtual original pattern (VOP) and the final virtual image (FVI). The criteria for matching the final virtual image (FVI) and the virtual original pattern (VOP) can also comprise a mathematical model of interaction between the fourth electromagnetic field (REF) and the exposed photosensitive material. Corrections of the first individual virtual light sources (FIVLS1, FIVLS2, . . . FIVLSm) can be made by a local variation comparison method or by any gradient method. The virtual digital hologram can also be corrected by a method of local variations or by any gradient method. The identities of the given virtual restoration wave (GWRV) and the actual restoration wave (ARW), which are used in the photolithography apparatus for illuminating the actual digital hologram (ADH) and obtaining the final actual image, are provided by an accurate aberration calculation of the optical system or by measuring the wave front of the actual restoration wave (ARW).

What is claimed is:

1. A method of microlithography with the use of divergent/convergent beams for holographic restoration of an image comprising the steps of:
    (a) introducing an orthogonal coordinate system x, y, z having three mutually perpendicular axes X-X, Y-Y, and Z-Z, choosing a point O on the axis Z-Z, and passing through this point a virtual digital hologram plane (VDHP), which is perpendicular to the axis Z-Z and which is to be used as a plane of a virtual digital hologram (VDH) for manufacturing the actual digital hologram;
    (b) selecting an orthogonal coordinate system x', y', z having three mutually perpendicular axes X'-X', Y'-Y', and Z-Z, choosing a point O' on the axis Z-Z that is spaced from the virtual digital hologram plane (VDHP) at a certain distance "d" and passing through this point O' a virtual original pattern plane (VOPP) that contains a virtual original pattern and is perpendicular to said arbitrary axis Z-Z, and wherein the virtual original pattern that contains image elements is to be used for subsequent synthesis of the virtual digital hologram;
    (c) selecting a nontransparent restricted area NTRA in the virtual original pattern plane (VOPP) and placing the virtual original pattern (VOP) in the nontransparent restricted area NTRA of the virtual original pattern plane (VOPP), the virtual original pattern (VOP) being formed by virtual image elements VIE;
    (d) applying onto the virtual original pattern plane (VOPP) a first virtual net FVN that divides the non-transparent restricted area (NTRA) into a plurality of first virtual unit cells;
    e) classifying the first virtual unit cells into white first virtual unit cells, black first virtual unit cells, and grey first virtual unit cells, wherein a white first virtual unit cell is obtained if a first virtual unit cell of the first net overlaps the virtual image elements of the virtual original pattern, a black first virtual unit cell is obtained if a first virtual unit cell of the first net overlaps only a space between the adjacent virtual image elements, and a grey virtual unit cell is obtained if a first virtual unit cell of the first net overlaps adjacent virtual image elements and a space between the adjacent virtual image elements;
    (f) presenting the virtual original pattern (VOP) in the form of a virtual digital amplitude-phase mask, wherein each first virtual unit cell is assigned a transmission value so that white first virtual unit cells are assigned a transmission value of 1.0, black first virtual unit cells are assigned a transmission value of 0.0, and grey first virtual unit cells are assigned a transmission value in the range of 0.0 to 1.0; all areas beyond the restricted area are assigned an amplitude value of 0.0; and wherein each first virtual unit cell has a function of a rotational phase shifter for shifting the phase in each respective first virtual unit cell when this first virtual unit cell passes the light of a diverged light beam of a first virtual light wave that has a given phase and amplitude, which are changed individually in each first virtual unit cell when the first virtual light wave FVLW passes through this cell, whereby a plurality of first individual virtual light sources selected from the group of point light sources and/or extended light sources is formed, and wherein each first individual virtual light source of said plurality acquires a precalculated phase and amplitude;

(g) carrying out an auxiliary correction of said acquired precalculated phase and amplitude for each first individual virtual light source of said plurality for obtaining a post-calculated distribution of said phase and amplitude of the first individual virtual light sources of said plurality;

(h) fixing the obtained post-calculated distribution of said phase and amplitude of the first individual virtual light sources of said plurality, said first individual virtual light sources generating a first electromagnetic field;

(i) applying a second virtual net onto the plane of the virtual digital hologram, thus dividing the plane of the virtual digital hologram into a plurality of second virtual unit cells and generating with the first light sources of said plurality a second electromagnetic field in the second virtual unit cells of the virtual digital hologram plane, in view of said divergent light beam of step f) an image pattern of the entire virtual hologram being increased from the dimensions of the original virtual pattern proportionally to the divergence of said divergent light beam;

(j) calculating an amplitude and phase of the second electromagnetic field in the virtual digital hologram plane from the first light sources of said plurality;

(k) providing a given virtual restoration wave that propagates from the virtual digital hologram plane to the virtual original pattern plane for subsequent restoration of the final virtual image and comprises a spherical or a nonspherical wave that converges to point O", which may or may not coincide with point O' on the virtual original pattern plane (VOPP), said given virtual restoration wave being complex conjugated to the first virtual light wave;

(l) inverting the given virtual restoration wave into a virtual reference wave to be used for calculating the virtual digital hologram;

(m) adding the virtual reference wave to the second electromagnetic field obtained in the second virtual unit cells for calculating interference amplitudes and phases obtained as a result of interference of the second electromagnetic field obtained from the first virtual light sources with the virtual reference wave;

(n) calculating the values of the virtual digital hologram in the second virtual unit cells based on the interference amplitudes and phases in each second virtual unit cell;

(o) passing the given virtual restoration wave through the virtual digital hologram plane, thus forming a plurality of second individual virtual light sources in the second unit cells, the second individual virtual light generating a third electromagnetic field in the virtual digital hologram plane;

(p) selecting a final virtual image plane for subsequent formation of the final virtual image, the final virtual image plane coinciding or not coinciding with the virtual original pattern plane (VOPP);

(q) applying a third virtual net onto the final virtual image plane, thus forming a plurality of third virtual units, the second individual light sources generating a fourth electromagnetic field in the third virtual unit cells;

(r) calculating amplitudes and phases of the fourth electromagnetic field;

(s) calculating the values of the final virtual image in the third virtual unit cells based on amplitudes and phases of the fourth electromagnetic field (REF) calculated in step (r);

(t) introducing a criterion of matching between the final virtual image and the virtual original pattern;

(u) comparing the final virtual image with the virtual original pattern based on the criterion of matching if deviations are present;

(v) minimizing the above deviation, if any, by repeating the steps (g), (h), (j), (m), (n), (o), (r), (s), and (u) until a satisfactory value of the criterion of matching is achieved and thus obtaining the final virtual digital hologram; and (w) manufacturing the actual digital hologram with use of the obtained final virtual digital hologram, which is greater than the virtual original pattern.

2. The method of claim 1, wherein the second electromagnetic field generated in the virtual digital hologram plane (VDHP) by a plurality of the first individual virtual light sources is expressed by the following formula (2):

$$U(x, y) = \int \int_S V(x', y') G(x-x', y-y', d) dx' dy' \qquad (2)$$

where:
V(x,y) is an electromagnetic field in the virtual original pattern plane (VOPP);

$$G(x, y, z) = -\frac{\partial}{\partial z}\left(\frac{e^{ikr}}{2\pi r}\right);$$

where: $r = \sqrt{x^2+y^2+z^2}$
k is a wave number equal to $2\pi/\lambda$, and
S is the nontransparent restricted area.

3. The method of claim 1, wherein numerical calculation of the amplitude and phase in the second virtual units is carried out based on the fast Fourier transform.

4. The method of claim 2, wherein numerical calculation of the amplitude and phase in the second virtual units is carried out based on the fast Fourier transform.

5. The method of claim 1, wherein the aforementioned given virtual restoration wave is reduced with the same degree of convergence as the degree of divergence in steps (f) to (j) to dimensions identical to an actual restoration wave (ARW), which is used for illuminating the actual digital hologram (ADH) and obtaining the final actual image.

6. The method of claim 2, wherein the aforementioned given virtual restoration wave is reduced with the same degree of convergence as the degree of divergence in steps (f) to (j) to dimensions identical to an actual restoration wave (ARW), which is used for illuminating the actual digital hologram (ADH) and obtaining the final actual image.

7. The method of claim 3 wherein the aforementioned given virtual restoration wave is reduced with the same degree of convergence as the degree of divergence in steps (f) to (j) to dimensions identical to an actual restoration wave (ARW), which is used for illuminating the actual digital hologram (ADH) and obtaining the final actual image.

8. The method of claim 4, wherein the aforementioned given virtual restoration wave is reduced with the same degree of convergence as the degree of divergence in steps (f) to (j) to dimensions identical to an actual restoration wave (ARW), which is used for illuminating the actual digital hologram (ADH) and obtaining the final actual image.

9. The method of claim 1, wherein the actual digital hologram is produced in the form of an amplitude layer having local regions that change the amplitude of the actual restoration wave (ARW) and each of which corresponds to a respective second virtual unit cell.

10. The method of claim 9, wherein the actual digital hologram (ADH) comprises a transparent substrate and a nontransparent layer formed on the transparent substrate and wherein the local regions that change the amplitude of the actual restoration wave (ARW) comprise a set of holes formed in the nontransparent layer.

11. The method of claim 10, wherein the holes are selected from the group consisting of holes of equal or different dimensions.

12. The method of claim 2, wherein the actual digital hologram is produced in the form of an amplitude layer having local regions that change the amplitude of the actual restoration wave (ARW) and each of which corresponds to a respective second virtual unit cell.

13. The method of claim 12, wherein the actual digital hologram (ADH) comprises a transparent substrate and a nontransparent layer formed on the transparent substrate and wherein the local regions that change the amplitude of the actual restoration wave (ARW) comprise a set of holes formed in the nontransparent layer.

14. The method of claim 13, wherein the holes are selected from the group consisting of holes of equal or different dimensions.

15. The method of claim 5, wherein the actual digital hologram is produced in the form of an amplitude layer having local regions that change the amplitude of the actual restoration wave (ARW) and each of which corresponds to a respective second virtual unit cell.

16. The method of claim 15, wherein the actual digital hologram (ADH) comprises a transparent substrate and a nontransparent layer formed on the transparent substrate and wherein the local regions that change the amplitude of the actual restoration wave (ARW) comprise a set of holes formed in the nontransparent layer.

17. The method of claim 16, wherein the holes are selected from the group consisting of holes of equal or different dimensions.

18. The method of claim 10, wherein the size of the holes ranges from $0.6$ to $0.9\lambda$, where $\lambda$ is a wavelength of the light of the first virtual light wave, second virtual light wave, and third virtual light wave and wherein said light is a monochromatic coherent light, the holes being selected from the group consisting of holes of equal or different dimensions.

19. The method of claim 10, wherein the size of the holes is equal to or greater than $1.7\lambda$, where $\lambda$ is a wavelength of the light of the first virtual light wave, second virtual light wave, and third virtual light wave and wherein said light is a monochromatic coherent light, the holes being selected from the group consisting of holes of equal or different dimensions.

* * * * *